United States Patent [19]
Webb et al.

[11] 4,233,619
[45] Nov. 11, 1980

[54] LIGHT DETECTOR HOUSING FOR FIBER OPTIC APPLICATIONS

[75] Inventors: Paul P. Webb, Beaconsfield; Robert J. McIntyre, Pointe-Claire, both of Canada

[73] Assignee: RCA Corporation, New York, N.Y.

[21] Appl. No.: 955,628

[22] Filed: Oct. 30, 1978

[30] Foreign Application Priority Data

Aug. 17, 1978 [CA] Canada .................................. 309545

[51] Int. Cl.² .................... H01L 23/02; H01L 27/14
[52] U.S. Cl. ........................................ 357/74; 357/30; 350/96.10; 350/96.17; 350/96.20
[58] Field of Search ................. 357/74, 30; 350/96.10, 350/96.17, 96.20, 96.21

[56] References Cited
U.S. PATENT DOCUMENTS

| | | | |
|---|---|---|---|
| 4,017,962 | 4/1977 | Palmer | 29/572 |
| 4,119,363 | 10/1978 | Camlibel | 350/96.2 |
| 4,144,541 | 3/1979 | Schoefer | 357/30 |

*Primary Examiner*—Martin H. Edlow
*Attorney, Agent, or Firm*—H. Christoffersen; Birgit E. Morris; William J. Burke

[57] ABSTRACT

A light pipe is inserted through the cap of a light detector housing and bonded to this cap. Light from a light transmitting fiber which impinges on the external end of the light pipe is transmitted with reduced loss of light to the light detector inside the housing.

8 Claims, 2 Drawing Figures

LIGHT DETECTOR HOUSING FOR FIBER OPTIC APPLICATIONS

This invention relates to an improved light detector housing useful in fiber optic communication systems.

BACKGROUND OF THE INVENTION

Communication systems using modulated light waves transmitted through a light transmitting optical fiber are becoming of increasing commercial importance. In these systems an electrical signal causes modulation of the output of a light source which is coupled into an optical fiber and transmitted through the fiber to another location. A light detector detects the transmitted light and converts the incident modulated light signal to a modulated electrical signal corresponding to the original electrical signal impressed upon the light source. These systems offer the advantages of large signal bandwidth, immunity from electrical noise, and small size. To be reliable the components of such systems must be shielded against the severe environmental conditions found in transmission and receiving installations and the distances between such installations.

The light detector used in such systems is typically a p-i-n or avalanche photodiode. The photodiode is encased in a housing which includes a header on which the light detector is mounted. Electrical leads, required for biasing the detector and transmitting the electrical signal corresponding to the detected light signal, are inserted through the header. The openings in the header, through which these leads are inserted and then sealed, have a glass to metal, an epoxy resin, or solder (if electrical contact to the header is desired) seal, to form a hermetic seal between the electrodes and the header. A cap, with a large area window in it to permit entry of light into the housing, is soldered or welded to the header to form a hermetic seal therebetween. The window is sealed to the cap using a glass to metal or an epoxy resin seal. Collins et al, U.S. Pat. No. 3,805,347 issued Apr. 23, 1974, teach a housing for use with a light emitting diode. Hacskaylo, U.S. Pat. No. 3,946,416 issued Mar. 23, 1976, teaches a low impedence housing for use with a laser diode. In both of these patents a large area window in the housing cap, essentially identical to that used for a prior art light detector housing, is shown.

Light detectors mounted in such prior art housings are not suitable for use in a fiber optic communication system such as described above since the window of the package will be typically at least 0.1 cm in thickness, and the light detector will be mounted some distance behind the inside surface of the window, typically 0.05 cm or more. A light beam exiting from a fiber optic cable butted against or in close proximity to the window will spread with a full angle corresponding to twice the numerical aperture of the fiber, typically 22 to 88 degress. The light beam spreads as it propagates through the window and the interior of the housing toward the light detector. The user is then faced with one of two alternatives; losing part of the detected signal, since the beam spreads and is not completely intercepted by the light detector; or, increasing the diameter of the detector to intercept the entire beam. The first alternative is unattractive because it requires either a larger amount of light to be initially coupled into the fiber to attain a given signal to noise ratio, or, correspondingly it decreases the length of a particular communication system. The second alternative is unattractive since, as the area of the detector increases, its capacitance also increases, which increases the detector noise current and time constant.

A third possibility is to remove the cap and window from the device completely. This alternative is also unattractive since the hermetic seal of the housing against the surrounding environment is destroyed.

Thus, it would be desirable to have a light detector housing in which all light emitted from an optical fiber intercepts the detector, with the detector size remaining comparable to the size of the fiber.

Goell et al, U.S. Pat. No. 4,065,203 issued Dec. 27, 1977, teach the use of an optical fiber contained in a support tube which is inserted through an opening in the cap of a laser diode housing. The tube is glued both to the mount of the laser diode and to the cap of the laser diode housing, extending through this housing into the region outside the cap. Goell et al do not teach the use of a fiber, alone, bonded to the cap nor do they teach a method for obtaining a hermetic seal of the fiber to the cap.

SUMMARY OF THE INVENTION

The light detector housing of the invention comprises a header, electrodes which are inserted through said header, a light detector having a light sensitive surface mounted on one of said electrodes, means for electrically connecting said light detector to said electrodes, a cap which encloses said light detector and said electrodes and which is bonded to said header, and a light pipe inserted through an opening in said cap which extends from the outer surface of said cap toward said light sensitive surface whereby a light beam from an external light source which impinges on said light pipe is transmitted toward said light sensitive surface with reduced spreading of the light beam.

DETAILED DESCRIPTION OF THE INVENTION

The invention is an improved light detector housing in which a light pipe is inserted through an opening in the cap and bonded to the cap. No additional support for the fiber is required beyond that provided by the bond to the cap. This light pipe transmits light emitted by an external source such as an optical fiber toward a light sensitive surface of the light detector within the housing. The light beam is typically emitted from the light pipe within about 0.025 cm of the light sensitive surface of the light detector and only then begins to spread.

Because the light pipe typically is straight and short, about 0.25 to 0.4 cm in length, significant mixing of the propagation modes of the light beam in the light pipe does not occur. Thus light coupled into and emitted out of the light pipe will retain the effective numerical aperture of the light source until the effective numerical aperture of the light source exceeds that of the light pipe. Up to this point, the coupling efficiency of light into the light pipe is high with the only significant losses due to reflectivity at the ends of the light pipe. When the effective numerical aperture of the light source is larger than that of the light pipe, the coupling efficiency of light into the light pipe decreases and the effective numerical aperture of light emitted by the light pipe is limited to about that of the light pipe.

Since the light pipe is very short no significant distortion of a light signal propagating in the light pipe occurs.

The numerical aperture of the light pipe is preferably larger than that of the light source to insure minimum loss of light into the light pipe cladding and to allow for some angular misalignment of the light source and the light pipe.

The diameter of the light pipe is preferably larger than that of a light source such as a fiber in a fiber optic cable to allow for some lateral misalignment of the fiber and the light pipe.

The numerical aperture of the fiber typically ranges from about 0.15 to about 0.7. The diameter of such a fiber typically ranges from about 0.005 cm to about 0.025 cm. A light pipe useful with such fibers should have a numerical aperture between about 0.2 and 0.7 and a diameter of between about 0.025 cm and about 0.05 cm. A preferred light pipe useful with fibers having different numerical apertures and diameters has a numerical aperture between about 0.5 and 0.7 and a diameter between about 0.025 and about 0.05 cm.

The invention can be more fully understood by reference to the accompanying drawings.

Figure 1:
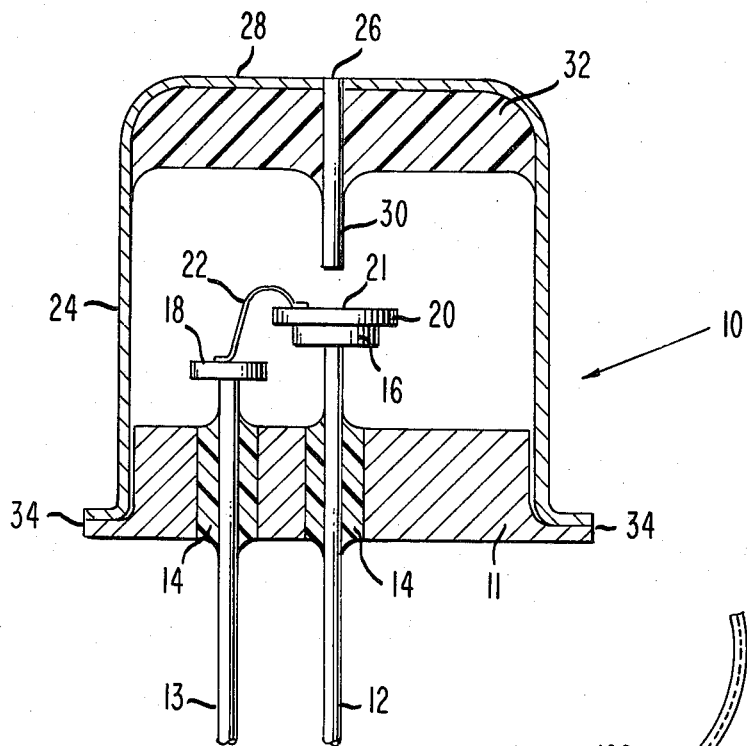
FIG. 1 shows a cross-sectional view of the light detector housing of the invention.

In FIG. 1 the light detector housing 10 comprises a header 11 through which are inserted electrodes 12 and 13. A seal 14 between electrodes 12 and 13 and header 11 is made by using either a curable epoxy resin or a glass to metal seal or, if electrical contact to the header 11 is desired, by soldering or welding to the header 11. Seal 14 as shown in FIG. 1 is glass to metal seal. Platforms 16 and 18 are either integral parts of electrodes 12 and 13 respectively or are plates bonded to and electrically connected to the electrodes 12 and 13 respectively. A light detector 20 having a light sensitive surface 21 is bonded to platform 16 making electrical contact through the bond to the electrode 12. Wire 22 provides electrical contact between the light detector 20 and the platform 18 and electrode 13.

An opening 26 is formed in the outer surface 28 of the cap 24. A light pipe 30, inserted through the opening 26 in the cap 24, extends from the outer surface 28 of the cap 24 toward the light sensitive surface 21 of the light detector 20. The light pipe 30 is bonded to the cap 24 with a curable epoxy resin 32 which provides both a hermetic seal against the environment and support for the light pipe 30. Alternatively, a light pipe 30 with a metallized exterior surface can be soldered to the cap 24. The cap 24 is bonded to the header 11 by soldering or welding at the joint 34.

A light detector housing of the invention was fabricated in the following manner.

A light detector which may be either a photoconductor, a depletion layer photodiode such as a p-i-n photodiode or an avalanche photodiode was soldered to a centrally positioned pedestal 16 on a header 11, such as the T046 optoelectronic header, using a 62.5 Sn/36 Pb/1.5 Ag solder preform. The second electrical connection to the light detector was made by bonding a wire to the other pedestal.

An opening was formed in the surface of the cap within about ±0.008 cm of the center of the surface. The cap was then placed onto a light pipe positioning jig. A light pipe which had a core diameter of about 0.025 cm, an overall diameter of core plus cladding of about 0.033 cm, and a numerical aperture of about 0.66 was inserted through the opening with a portion of the fiber protruding beyond the surface. The positioning jig positioned the light pipe and cap so that the end of the light pipe enclosed by the cap and header was centered radially within the cap to within about ±0.005 cm. The positioning jig also positioned the light pipe so that it extended to the desired depth inside the cap, typically within about 0.025 cm of the light sensitive surface of the light detecting device in the assembled housing. The light pipe, typically about 0.25 cm to 0.40 cm long, was then fastened to the surface using a mixture of 1 part Stycast 1264A epoxy resin and 0.45 parts 1264B hardener, manufactured by Emerson and Cuming, Inc. After this mixture cured, the cap with the light pipe was removed from the positioning jig. A mixture of 1 part H70EA epoxy resin and 1 part H70EB hardener manufactured by Epoxy Technology, Inc., was then used as the curable epoxy resin to form a hermatic seal between the light pipe and the cap. The H70E epoxy resin and hardener could not be used to fasten the light pipe since chipping of the light pipe resulted during polishing.

The portion of the light pipe protruding beyond the surface was then ground to the surface using 600 grit carborundum paper. After grinding, this end of the light pipe was polished using 1 micron and then 0.3 micron $Al_2O_3$ powder on a polishing cloth.

The cap was then bonded to the header using standard resistance welding techniques.

A light detector housing of the invention using a p-i-n light detector was tested as follows. A beam of light was focussed onto the light detector mounted on a header and the electrical output signal was measured. A cap with a light pipe was then mounted on and bonded to the header. The same light beam was then focussed on the external end of the light pipe and the electrical output signal was measured. The electrical output signal with the cap was eleven percent less than that measured without the cap. The signal loss was due almost entirely to reflection losses at the ends of the light pipe. This showed that essentially no spreading of the beam occured when the housing of the invention was used.

The light loss due to reflection at the ends of the light pipe can be further reduced by the use of anti-reflection coatings.

Figure 2:
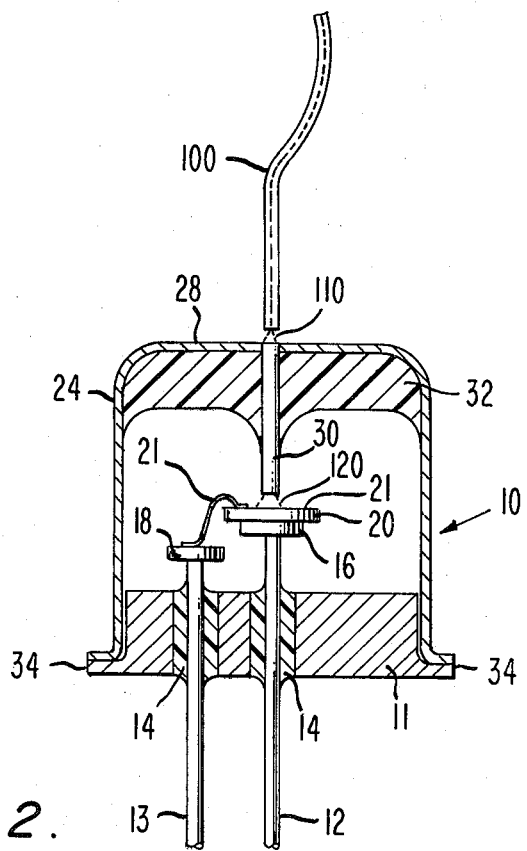
FIG. 2 shows a cross-sectional view of the light detector housing of the invention in conjunction with a light transmitting fiber optic cable.

In FIG. 2 the light detector housing of the invention in a fiber optic communication system is illustrated. An electrical signal impressed upon a light emitting device (not shown) produces a modulated light output from said device which is coupled into one end of an optical fiber 100. A light beam 110 is emitted from the other end of the fiber 100 with a beam divergence corresponding to the numerical aperture of the fiber 100. The light beam 110 impinges on the light pipe 30 in the cap 24 of the light detector housing 10 and is transmitted through said light pipe 30 toward the light detector 20. The light beam 20 is emitted from the opposite end of the light pipe 30, directed towards the light sensitive surface 21 of the light detector 20 where it is detected, converted into an electrical signal which, in turn, is detected by external electrical circuits (not shown).

We claim:

1. In a light detector housing comprising
a header,
electrodes which are inserted through said header, a light detector having a light sensitive surface mounted on one of said electrodes, means for electrically connecting said light detector to said electrodes, a cap bonded to said header which encloses said light detector, and a window in said cap opposite to said light sensitive surface whereby light from an external light source impinging on said window enters said housing and impinges on said light sensitive surface, the improvement which consists essentially of a light pipe inserted through an opening in said cap, bonded to said cap and extending from the outer surface of said cap toward said light sensitive surface whereby light from an external light source which impinges on said light pipe is transmitted toward said light sensitive surface with reduced spreading of the light beam.

2. A light detector housing according to claim 1 wherein said light detector is a photoconductor.

3. A light detector housing according to claim 1 wherein said light detector is a depletion layer photodiode.

4. A light detector housing according to claim 3 wherein said depletion layer photodiode is a p-i-n photodiode.

5. A light detector housing according to claim 1 wherein said light detector is an avalanche photodiode.

6. A light detector housing according to claim 1 wherein the numerical aperture of said light pipe is between about 0.2 and about 0.7.

7. A light detector housing according to claim 1 wherein the numerical aperture of said light pipe is between about 0.5 and 0.7.

8. A light detector housing according to claim 1 wherein said light pipe is bonded to said cap with a curable epoxy resin.

* * * * *

UNITED STATES PATENT AND TRADEMARK OFFICE
CERTIFICATE OF CORRECTION

PATENT NO. : 4,233,619

DATED : November 11, 1980

INVENTOR(S): Paul Perry Webb et al

It is certified that error appears in the above-identified patent and that said Letters Patent is hereby corrected as shown below:

In the Specification:

Column 1, line 58    "degress" should be --degrees--

Column 4, line 60    "20" should be --120--

Signed and Sealed this

Second Day of June 1981

[SEAL]

Attest:

RENE D. TEGTMEYER

Attesting Officer    Acting Commissioner of Patents and Trademarks

UNITED STATES PATENT AND TRADEMARK OFFICE
CERTIFICATE OF CORRECTION

PATENT NO. : 4,233,619

DATED : November 11, 1980

INVENTOR(S) : Paul Perry Webb et al

It is certified that error appears in the above-identified patent and that said Letters Patent is hereby corrected as shown below:

In the Heading under Assignee:

Assignee should be --RCA Limited, Quebec. Canada --.

Column 4, line 21    "hermatic" should be --hermetic--

Claim 4, line 3    "photodide" should be --photodiode--

Signed and Sealed this

Twenty-eighth Day of July 1981

[SEAL]

Attest:

GERALD J. MOSSINGHOFF

Attesting Officer    Commissioner of Patents and Trademarks